United States Patent [19]

Gross

[11] Patent Number: 5,734,293
[45] Date of Patent: Mar. 31, 1998

[54] FAST CURRENT FEEDBACK AMPLIFIERS AND CURRENT-TO-VOLTAGE CONVERTERS AND METHODS MAINTAINING HIGH DC ACCURACY OVER TEMPERATURE

[75] Inventor: William H. Gross, Sunnyvale, Calif.

[73] Assignee: Linear Technology Corporation, Milpitas, Calif.

[21] Appl. No.: 746,761

[22] Filed: Nov. 15, 1996

Related U.S. Application Data

[63] Continuation of Ser. No. 483,992, Jun. 7, 1995, abandoned.
[51] Int. Cl.$^6$ .................................................. G06G 7/12
[52] U.S. Cl. .................. 327/561; 327/563; 327/103; 327/317; 323/316
[58] Field of Search ........................... 327/103, 317, 327/561, 562, 563, 538, 545, 546; 323/316

[56] References Cited

U.S. PATENT DOCUMENTS

| | | | |
|---|---|---|---|
| 4,350,904 | 9/1982 | Cordell | 307/310 |
| 4,618,816 | 10/1986 | Monticelli | 323/316 |
| 5,334,929 | 8/1994 | Schade, Jr. | 323/315 |
| 5,430,395 | 7/1995 | Ichimaru | 327/312 |
| 5,493,205 | 2/1996 | Gorecki | 323/315 |

OTHER PUBLICATIONS

Sergio Franco, "25. Current–Feedback Amplifiers," *Analog Circuit Design: Art, Science, and Personalities*, 261–76 (Jim Williams ed., Butterworth–Heinemann 1991).

Analog Devices, Inc., *1992 Amplifier Reference Manual*, 2–363 –2–374, 2–383 –2–394 (1992).

Primary Examiner—Timothy P. Callahan
Assistant Examiner—Jung Ho Kim
Attorney, Agent, or Firm—Fish & Neave; Robert W. Morris; Elaine A. Drager

[57] ABSTRACT

Current feedback amplifier circuits, and current-to-voltage converter circuits, employing operational amplifier current mirror circuits are provided. Also provided is an output compensation circuit that, in a current feedback amplifier circuit employing the output compensation circuit together with the operational amplifier current mirrors, reduces the input bias current to be comparable to the input bias current of a voltage feedback amplifier. Additionally, a circuit and method of providing a current source that is proportional to absolute temperature is provided. A current feedback amplifier circuit employing the output compensation circuit and the operational amplifier current mirrors, and having input transistors biased by the proportional to absolute temperature current source is also provided. The drift of the input bias current over temperature are thereby made predictable and, with trimming, substantially reduced. The current feedback amplifier circuit and current-to-voltage converter circuit are thus both fast and highly accurate, including over temperature. Additionally, an optical storage accessing circuit which employs the current feedback amplifier circuit of the present invention.

47 Claims, 7 Drawing Sheets

FAST CURRENT FEEDBACK AMPLIFIERS AND CURRENT-TO-VOLTAGE CONVERTERS AND METHODS MAINTAINING HIGH DC ACCURACY OVER TEMPERATURE

CROSS REFERENCE TO RELATED APPLICATION

This application is a file-wrapper continuation of U.S. patent application Ser. No. 08/483,992, filed Jun. 7, 1995, now abandoned.

BACKGROUND OF THE INVENTION

This invention relates to current feedback amplifier circuits, current-to-voltage converter circuits and other circuits which incorporate current feedback amplifier circuits and current-to-voltage converter circuits. More particularly, the present invention relates to current feedback amplifier circuits and current-to-voltage converter circuits which provide wide bandwidth, fast settling time, large gain and high direct current ("DC") accuracy over time and temperature. The present invention also pertains to detection circuits employing the above-identified current feedback amplifier circuits, and the current-to-voltage converter circuits, to ensure rapid and accurate conversion of currents to voltages.

Many of the reasons for designing current feedback amplifiers, rather than voltage feedback amplifiers, are known. Conventional voltage feedback operational amplifier circuits may be subject to the speed limitations typical of "voltage-mode" operation, stemming primarily from the stray capacitances of terminals and cutoff frequencies of transistors. In comparison, "current-mode" operation has long been recognized as inherently faster than voltage-mode operation, at least because: (1) the effect of stray inductance in an integrated circuit is less severe than that of stray capacitance; and (2) bipolar junction transistors ("BJTs") switch current faster than voltage. Current feedback amplifiers also do not suffer the typical gain-bandwidth trade-off of conventional operational amplifiers.

In view of these and other considerations, current feedback amplifiers are useful in a variety of applications, including circuits and methods for converting input currents to output voltages ("I/V converters").

I/V converter circuits and methods are themselves useful in a variety of circuits, including circuits involved with accessing optical storage. For example, such optical storage devices may operate by using photo diodes to detect laser light reflected from an optical storage "disk" surface. The intensity of the reflected light may represent whether data on the disk is a "one" or a "zero." In addition, the intensity of the reflected light may be used to provide information for focussing, aligning and adjusting the laser.

For a given detection system, the photo diodes are preferably located on one silicon chip, thereby having essentially the same photoelectrical characteristics. The amount of current each photo diode produces indicates the intensity of light at that diode's position. The laser can be properly focused and aligned on the correct part of the disk by comparing the amount of current from the photo diodes. As part of this focussing and alignment of the laser, the photo diode output current signals must be DC coupled to focus and positioning servo systems. However, because of the difficulty in accurately signal processing the photo diode currents directly, these currents are often converted to voltages.

Such conversion of photo diode currents to voltages must be fast and, at least because of the DC coupling to the servo systems involved in focussing and aligning the laser, must have high DC accuracy. Furthermore, the drift of the DC offset errors over temperature is important because the initial offset can be trimmed only at one time and temperature. Additionally, in view of the common occurrence of such requirements, numerous other circuits may also benefit from fast and highly accurate I/V converters, particularly I/V converters with low drift.

There are numerous known I/V converter circuits and methods, the simplest being a resistor. In a resistor I/V converter, the value of a resistor (R) determines current (I) to voltage (V) gain: V=I×R. The resistor I/V converter has no DC offset error, and the bandwidth is determined by the resistor value and the total capacitance of the circuit (including any stray capacitance). However, one limitation of the resistor I/V converter is that it lacks speed. A further limitation of the resistor I/V converter is that, to accurately drive any circuitry which uses the output voltage of the resistor I/V converter, the output voltage must be buffered. The addition of a buffer to the resistor I/V converter introduces the DC offset errors of the buffer, as well as the drift of those errors with time and temperature, to the resistor I/V converter circuit. Moreover, in view of any stray capacitance, to achieve high gain (R) in the resistor I/V converter, bandwidth must be sacrificed. Alternatively, high bandwidth can be achieved by reducing the resistor value (R), but the buffer must make up the reduced gain. Increasing the buffer gain, however, amplifies DC offset errors of the buffer.

Because of these problems associated with the resistor I/V converter, another I/V converter employing an operational amplifier ("op amp") is sometimes used. However, op amps have inherent DC accuracy limitations due to certain offset errors arising from DC parameters of the op amp, such as input offset voltage and input bias currents. In addition, the input offset voltage and bias currents may drift with temperature.

Configuring an op amp in a voltage feedback operational amplifier I/V converter circuit can achieve low DC offset errors and drift, particularly where the op amp operates at unity gain. But, achieving fast settling response and wide bandwidth requires accurate cancellation of capacitance (including any stray capacitance) with a feedback capacitor. However, such cancellation is particularly difficult because, among other things, the stray capacitance of a circuit is often not well controlled. Moreover, faster op amps have higher input offset voltages and input bias currents, which result in lower DC accuracy.

Because of the limitations associated with voltage feedback operational amplifier I/V converters, using a current feedback amplifier as an I/V converter has several advantages. For example, with a current feedback amplifier, the feedback capacitor used to cancel capacitance in the voltage feedback amplifier is not needed. Additionally, capacitance on the inverting input of a current feedback amplifier has less effect on the bandwidth of a current feedback amplifier because of the very low impedance at that inverting input.

However, many traditional current feedback amplifiers suffer the disadvantages of DC offset error and drift. The input offset voltage component of the DC offset error, as well as the drift of the input offset voltage, can be made very low by proper biasing of the current feedback amplifier. On the other hand, the input bias current component of the offset error is harder to control in a current feedback amplifier than the input bias current component of the offset error is to control in a voltage feedback op amp. This is because the input bias current of a current feedback amplifier includes a difference in emitter currents of the input transistors. Further, the input bias current of a voltage feedback operational amplifier is comprised of base current of a bipolar junction transistor. As such, the input bias current of the voltage feedback amplifier is inherently smaller than the input bias current of a current feedback amplifier.

In view of the foregoing, it would be desirable to provide fast current feedback amplifier circuits having high DC accuracy.

It would also be desirable to provide fast current feedback amplifiers with very low DC offset drift over time and temperature.

It would be further desirable to provide fast I/V converter circuits and methods with high DC accuracy, wide bandwidth, and fast settling time.

It would be still further desirable to provide fast I/V converter circuits and methods with very low DC offset drift over time and temperature.

It would be even still further desirable to provide I/V converter circuits with high gain, so as to reduce the DC offset accuracy requirement of any further circuitry dependent upon the output of the I/V converters.

Additionally, it would be desirable to provide I/V converters including a current feedback amplifier circuit and a circuit for, and method of, minimizing the input bias current.

And, it would be desirable to provide a circuit for rapidly converting photo diode currents to voltages while maintaining high DC accuracy.

SUMMARY OF THE INVENTION

It is therefore an object of the invention to provide fast current feedback amplifier circuits having high DC accuracy.

It is another object of the invention to provide fast current feedback amplifiers with very low DC offset drift over time and temperature.

It is a further object of this invention to provide fast I/V converter circuits and methods with high DC accuracy, wide bandwidth and fast settling time.

It is still a further object of this invention to provide fast I/V converter circuits and methods with very low DC offset drift over time and temperature.

It is yet a further object of this invention to provide I/V converter circuits with high gain, so as to reduce the DC offset accuracy requirement of any further circuitry dependent upon the output of the I/V converters.

It is still yet a further object of this invention to provide I/V converters including a current feedback amplifier circuit and a circuit for, and method of, minimizing the input bias current.

And it is a further object of this invention to provide a circuit for rapidly converting photo diode currents to voltages while maintaining high DC accuracy.

In accordance with these and other objects of the invention, a fast and highly accurate current feedback amplifier circuit and method employing operational amplifier current mirrors is provided. Also provided is a current-to-voltage converter circuit and method, in which the current feedback amplifier circuit and method employing operational amplifier current mirrors are utilized. Furthermore, it is provided that the invented current-to-voltage converter may be used in an improved optical storage accessing circuit to convert the currents generated by photo diodes upon the detection of reflected laser light in optical storage applications.

Additionally, a method of providing fast and highly accurate current feedback amplification, regardless of inaccuracies arising from drift with temperature is provided. Also provided is a circuit and method of providing a proportional to absolute temperature current. And, a method of rapidly and accurately converting an input current to an output voltage, regardless of inaccuracies arising from drift with temperature is provided.

BRIEF DESCRIPTION OF THE DRAWINGS

The above and other objects of the present invention will be apparent upon consideration of the following detailed description, taken in conjunction with the accompanying drawings, in which like reference characters refer to like parts throughout, and in which.

DETAILED DESCRIPTION OF THE INVENTION

Current feedback amplifier circuits incorporating the principles of the present invention are described below. The current feedback amplifier circuits provided are fast and highly accurate, due in part to their use of operational amplifier current mirrors. Furthermore, a circuit and method of reducing the deficiencies described above for a current feedback amplifier's offset drift with temperature is explained.

In addition, current-to-voltage converter circuits ("I/V converters") and methods are described which employ the described current feedback amplifiers, providing fast and highly accurate current-to-voltage conversion, and reducing drift with temperature. Also described is an improved optical storage accessing circuit using the described current feedback amplifier and I/V converter circuits and methods.

As discussed above, there are numerous known I/V converter circuits and methods, the simplest being a resistor. In addition, I/V converter circuits are themselves useful in a variety of applications such as in optical storage accessing circuitry. As also explained above, in optical storage accessing circuits, reflected laser light and the corresponding current produced by detection photo diodes provides information regarding the value of data, as well as information for focussing and aligning the laser. Because of the difficulty in directly processing current signals, photo diode currents are often converted to voltages.

Figure 1:
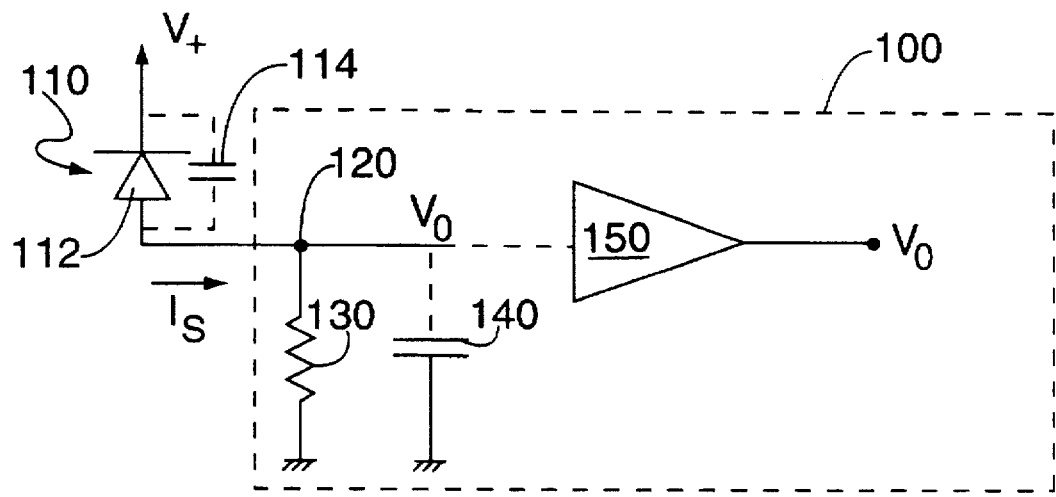
FIG. 1 is a simplified schematic diagram of a known circuit for detecting intensity of light, employing a resistor current-to-voltage converter circuit.

FIG. 1 illustrates a known simplified optical storage accessing circuit employing a resistor I/V converter circuit 100. Reflected laser light 110 causes photo diode 112 to generate a current $I_s$ (the direction of $I_s$ indicated in FIG. 1 being arbitrary and for purposes of example). Current $I_s$ is provided as the input signal to resistor I/V converter 100 at node 120. The output voltage $V_o$ is generated at node 120 due to current $I_s$ passing through resistor 130 (R). Thus, the value of resistor 130 determines the current to voltage gain ($V_o = I_s \times R$).

An advantage of resistor I/V converter 100 is that, in the absence of buffer 150 (shown as optional on FIG. 1 by the dashed connection to node 120), the converter has no DC offset error.

However, one limitation of resistor I/V converter 100 is that it lacks speed. The bandwidth is determined by the value of resistor 130 and the total capacitance of the circuit, which includes stray capacitance 140 and any inherent capacitance 114 in photo diode 112.

A further limitation of resistor I/V converter 100 is that, to accurately drive circuitry which uses output voltage $V_o$, the output voltage $V_o$ must be buffered, as optionally shown in FIG. 1, for example, with buffer 150. However, the addition of buffer 150 to resistor I/V converter 100 introduces the DC offset errors of buffer 150, as well as the drift of those errors with time and temperature, to resistor I/V converter 100.

Moreover, in view of diode capacitance 114 and stray capacitance 140, to achieve high gain with a large resistor 130 in resistor I/V converter 100, bandwidth must be sacrificed. Alternatively, higher bandwidth can be achieved by reducing the value of resistor 130, but buffer 150 must compensate for the reduced gain due to the lower value of resistor 130. Increasing the gain of buffer 150, however, amplifies DC offset errors of buffer 150.

For a typical optical storage accessing circuit, the bandwidth of the I/V converter needs to be greater than 10 MHz and the output should settle to within 0.5% of final value in less than 200 ns for a 100 µA input step. A typical output current of a photo diode 112 ranges from about 1 µA to 100 µA. A conversion gain of 20 mV/µA results in an output signal of 2 V peak-to-peak, which may be accommodated by a 5 V or 10 V supply voltage. The initial offset errors of an I/V converter in, for example, an optical storage accessing circuit, are typically trimmed at room temperature, however the drift of the offset errors with temperature should not exceed 10% of the minimum input signal. For a 1 µA input and a 50° C. maximum change in operating temperature, the I/V converter should have an input offset error due to drift of less than 2 nA/° C. Therefore, for a 20 mV/µA conversion gain, the output offset voltage error due to drift should be less than 40 µV/° C.

Resistor I/V converter 100 cannot meet these requirements of a typical optical storage accessing circuit. For a 20 mV/µA gain, a 20 k-ohm resistor must be selected. If the total capacitance of the optical storage accessing circuit is as little as 5 pF, the resultant bandwidth of resistor I/V converter 100 is only 1.6 MHz, which is significantly slower than the 10 MHz minimum.

Figure 2:
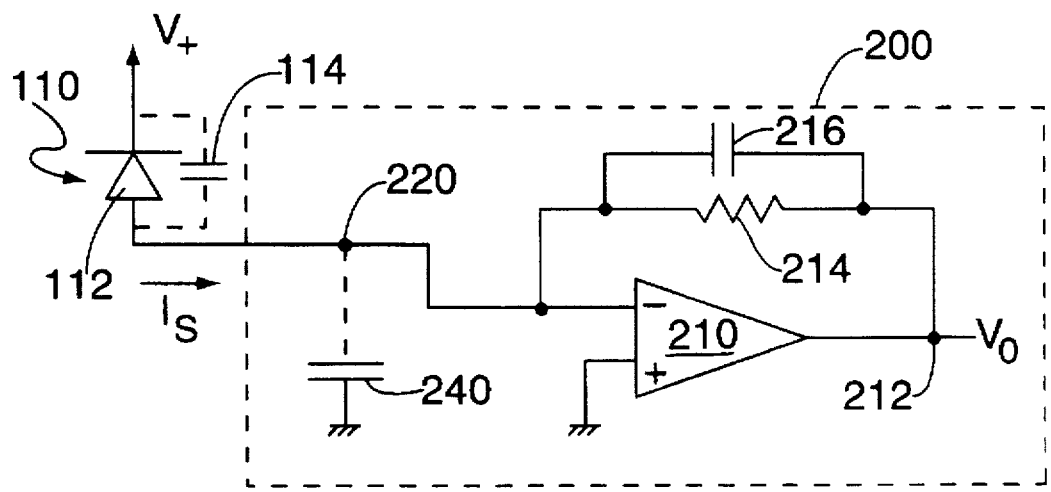
FIG. 2 is a simplified schematic diagram of a traditional circuit for detecting intensity of light, employing a conventional current-to-voltage converter circuit using a voltage feedback operational amplifier.

Because the required parameters of a typical optical storage accessing circuit are not attainable with a simple resistor I/V converter circuit, such as resistor I/V converter 100, most present I/V converters in optical storage accessing circuits use a voltage feedback operational amplifier I/V converter circuit, such as the one shown by FIG. 2.

Referring to FIG. 2, elements 110, 112, and 114 are substantially identical to, and behave in exactly the same way, as the like-numbered elements described with regard to FIG. 1. Current $I_s$ is the input signal (once again, the direction indicated for $I_s$ is arbitrary) to voltage feedback amplifier I/V converter 200 at node 220. Output voltage $V_o$ is generated at node 212.

In typical operations, any photo diode current input signal $I_s$ causes the voltage at node 220 to vary. This in turn causes the output voltage $V_o$ of operational amplifier ("op amp") 210 to vary at node 212. The value of feedback resistor 214 determines the amount of current-to-voltage gain converter 200 provides.

As mentioned above, op amps have inherent DC accuracy limitations due to certain offset errors arising from DC parameters of the op amp, such as input offset voltage and input bias currents. In addition, the input offset voltage and bias currents typically drift with temperature. Faster op amps have higher input offset voltages and input bias currents, which result in lower DC accuracy.

Low DC offset errors and drift may be achieved by using voltage feedback operational amplifier I/V converter circuit 200, particularly where op amp 210 operates at unity gain. However, to achieve fast settling response and wide bandwidth requires accurate cancellation of capacitance, including any diode capacitance 114 and stray capacitance 240, by a feedback capacitor 216.

For example, the 20 mV/µA conversion gain requirement of a typical optical storage accessing circuit (as described above with respect to FIG. 1), implies that feedback resistor 214 should be 20 K-ohm. Assuming diode capacitance 114 and stray capacitance 240 produce a total capacitance of only 5 pF, that capacitance and the 20 K-ohm feedback resistor create a pole at about 1.6 MHz. Such a bandwidth is insufficient for a typical optical storage accessing circuit. To move the pole out to a higher frequency, such as 10 Mhz, the value of feedback resistor 214 may be lowered, but adjusting resistor 214 down causes a loss in gain which must be compensated for by additional amplifiers, which increase both cost and offset errors.

Thus, in a typical optical storage accessing circuit using voltage feedback operational amplifier I/V converter 200, the pole due to diode capacitance 114 and stray capacitance 240 in connection with feedback resistor 214 must be cancelled by feedback capacitor 216, in order to use fast op amp 210. Additionally, cancellation feedback capacitor 216 must be highly accurate to achieve the required fast output settling. However, such cancellation is further complicated by the fact that the diode capacitance 114 and stray capacitance 240 are not well controlled.

Because of the limitations associated with voltage feedback operational amplifier I/V converters, using a current feedback amplifier as an I/V converter has several advantages. For example, with a current feedback amplifier, the feedback capacitor 216 used to cancel capacitance in voltage feedback amplifier 200 is not needed, an in fact must not be used.

Figure 3:
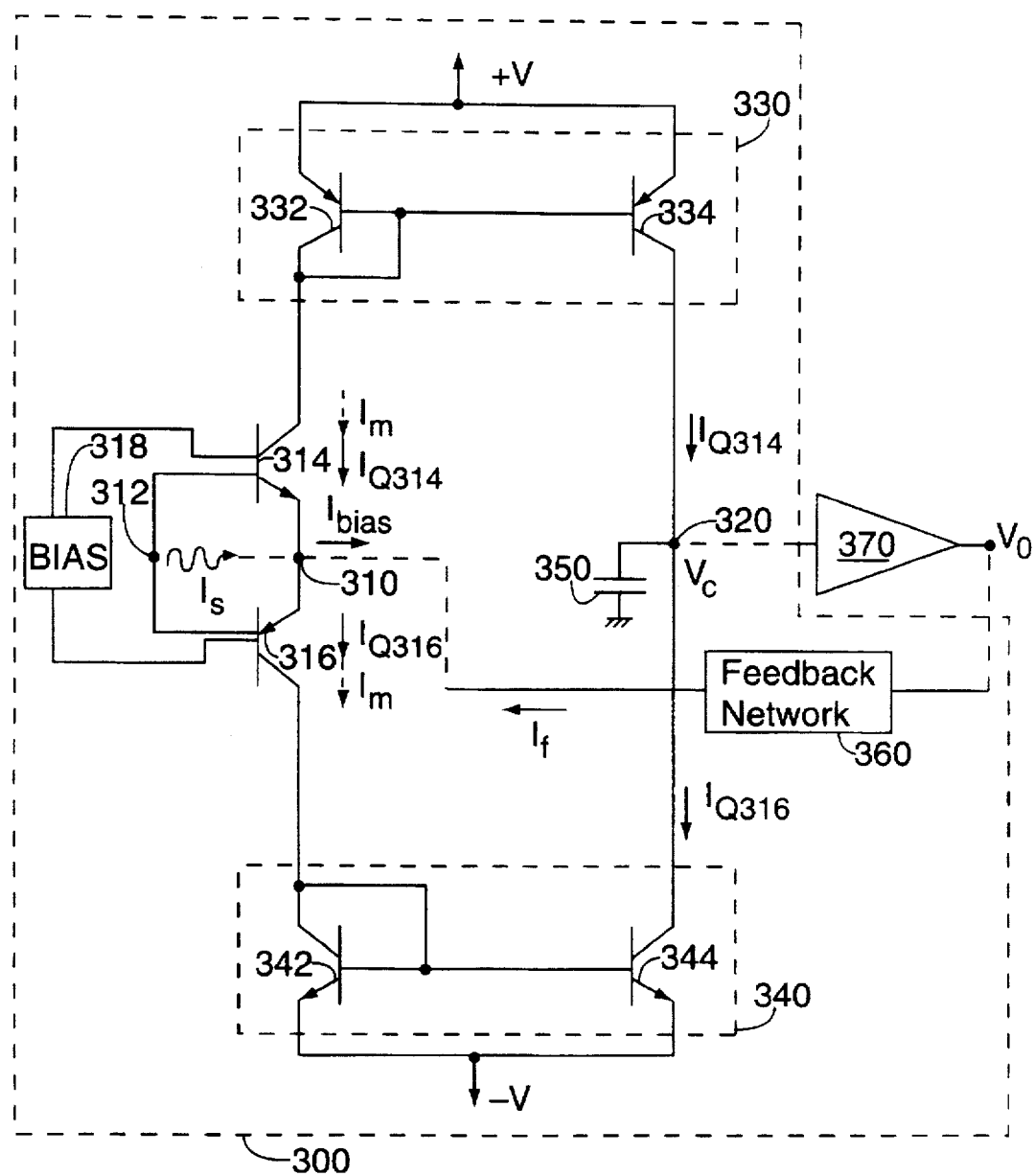
FIG. 3 is a schematic diagram of a conventional current-to-voltage converter circuit employing a current feedback amplifier.

FIG. 3 is a schematic diagram of a conventional current-to-voltage converter circuit employing a current feedback amplifier.

Referring to FIG. 3, a conventional current feedback amplifier circuit 300 having an inverting input terminal 310, a non-inverting input terminal 312, and an output terminal 320, is shown.

Amplifier circuit 300 includes NPN-type bipolar junction transistor 314 and PNP-type bipolar junction transistor 316 having their emitters coupled together at terminal 310 and their bases coupled together at terminal 312. Additionally, transistors 314 and 316 are biased by biasing circuitry 318, which establishes quiescent currents passing through transistors 314 and 316. Transistors 314 and 316 form a low impedance push-pull input stage. However, as apparent to those skilled in the art, the input stage is not restricted to this configuration.

On FIG. 3, summing the currents at terminal 310, the difference between the currents passing through transistors 314 and 316 ($I_{Q314}$ and $I_{Q316}$) equals an error current $I_{bias} = I_{Q316} - I_{Q314}$.

Amplifier circuit 300 also includes a pair of current mirrors 330 and 340, each consisting of a diode-connected transistor, 332 and 342, and a matching-in-type transistor, 334 and 344, respectively. Current mirrors 330 and 340 reflect currents passing through transistors 314 and 316, and recombine those currents at output node 320. The equivalent capacitance of node 320 to ground is shown on FIG. 3 as internal compensation capacitor 350. A voltage $V_c$ is developed at node 320.

In current feedback amplifier 300, a negative feedback network 360 may be provided between terminals 310 and 320. In such a configuration, when an external signal tries to cause a difference in voltage between inverting input terminal 310 and non-inverting input terminal 312, or if an external signal pushes or pulls current into or out of terminal 310, transistors 314 and 316 begin sourcing and sinking an imbalance current $I_m$. The result of this sourcing and sinking of imbalance current $I_m$ is that the currents passing through transistors 314 and 316 ($I_{Q314}$ and $I_{Q316}$) vary from the quiescent currents, in opposite directions, in the amount of imbalance current $I_m$. Thus, for example, the current passing through transistor 316 would get larger by $I_m$, and correspondingly, the current passing through transistor 314 would get smaller by $I_m$. The varied currents through transistors 314 and 316 are conveyed by current mirrors 330 and 340 to internal compensation capacitor 350, causing voltage $V_c$ at terminal 320 to swing and provide a feedback current $I_f$ through feedback network 360 until the original imbalance current is neutralized via negative feedback.

By applying an input current signal $I_x$ to input terminal 310 in a current feedback amplifier with negative feedback, and monitoring the voltage at terminal 320, the circuit may provide I/V conversion. The input current signal $I_x$ acts as the external signal that causes transistors 314 and 316 to begin sourcing and sinking imbalance current $I_m$, as described above, such that the voltage $V_c$ provides an output voltage $V_o$ in response.

To accurately drive circuitry which uses output voltage $V_o$ of current feedback amplifier I/V converter 300, however, requires inserting an output buffer 370 between terminal 320 and feedback network 360, as optionally shown in FIG. 3.

The bandwidth of the described current feedback amplifier circuits is determined by feedback network 360 and internal compensation capacitor 350.

In current feedback amplifier 300, capacitance on inverting input terminal 310 has less effect on the bandwidth of current feedback amplifier 300 than a similar capacitance would have on the bandwidth of voltage feedback amplifier 200, at least in part because of the very low impedance at inverting input terminal 310. Therefore, the pole formed by the capacitance at inverting input terminal 310 is usually many times higher than the bandwidth of current feedback amplifier 300, and thus has very little effect on settling time. Accordingly, feedback capacitor 216 of voltage feedback operational amplifier 200 is not needed for current feedback amplifier 300. This means, for example, that it is feasible to locate current feedback amplifier I/V converter 300 at further distances from the photo diodes in an optical storage accessing device because the increased capacitance due to the longer distance connections is acceptable.

In fact, any feedback capacitance for current feedback amplifier 300, including stray capacitances, between output terminal 320 and input terminal 310 of current feedback amplifier 300 must be minimized. To reduce the effects of stray capacitance between the output and input terminals, most commercial current feedback amplifiers are optimized for feedback resistors of 1 k-ohm or less. Unfortunately, the resultant gain is too low.

Additionally, traditional current feedback amplifiers, such as the one shown in FIG. 3, suffer the disadvantages of DC offset error and drift. As is known by persons skilled in the art, the input offset voltage component of the offset error, as well as the drift of the input offset voltage can be made very low by proper biasing. However, the input bias current component of the offset error is harder to control in a current feedback amplifier than the input bias current component of the offset error is to control in a voltage feedback operational amplifier. This is because the input bias current of a current feedback amplifier is typically a difference in emitter, or other relatively large, currents. On the other hand, the input bias current of a voltage feedback operational amplifier is comprised of base current of a bipolar junction transistor, or the gate current of a metal-oxide-semiconductor or junction field-effect transistor ("MOSFET" or "JFET"). As such, the input bias current of a voltage feedback amplifier is inherently smaller than the input bias current of a current feedback amplifier.

Further examination of FIG. 3 reveals three main sources of input bias currents at inverting input terminal 310. First, the mismatch in alpha, where alpha=beta/(beta+1) and beta is a constant for a particular transistor, of transistors 314 and 316 results in an input bias current component $I_{bias\_Q314:Q316\_alpha}$. The second source is the mismatch in the gains of current mirrors 330 and 340. This gain mismatch produces input bias current component $I_{bias\_mirror\_gains}$. Third, the input bias current of buffer 370 results in an input bias current component $I_{bias\_B370\_Ibias}$ in the current feedback amplifier. Of these three sources of input bias current, $I_{bias\_mirror\_gains}$ is the largest. In addition, the input bias current components of traditional current feedback amplifiers may drift with temperature.

As is known in the art, by employing Wilson current mirrors as the biasing circuitry 318 for transistors 314 and 316, the alpha error input bias current $I_{bias\_Q314:Q316\_alpha}$ caused by mismatch of the alphas of transistors 314 and 316, is first order eliminated.

In such a configuration, only the mismatching of beta between similar types of transistors generates an input bias current caused by transistors 314 and 316. In a typical integrated circuit process, the beta matching of identical transistors is better than 5%. Thus, for example, if transistor 314 and one of the transistors of its Wilson current mirror mismatch in beta by 5%, and all the other transistors are perfectly matched, the beta mismatch error input bias current is approximately 0.024% of the collector currents. As such, this source of input bias current is insignificant in comparison to the other sources of input bias current.

Additionally, it is known in the art to employ Wilson current mirrors or base current compensating circuits instead of simple current mirrors 330 and 340, to compensate for the alpha mismatch of transistors 332 and 334, and transistors 342 and 344. However, doing so does not overcome the all of the problems associated with the mismatch in the gains of the current mirrors. Due to the difficulty of area-scaling matching the $V_{be}$'s of transistors, the best case matching is typically 3%. Even assuming the best case while using Wilson current mirrors instead of simple current mirrors 330 and 340, the input bias current component due to mismatch of the gains of the current mirrors in the current feedback amplifier of FIG. 3, $I_{bias\_mirror\_gains}$, remains the largest bias current. Furthermore, the drift of this bias current component with temperature cannot be trimmed down.

In comparison, as discussed in detail below, the deficiencies of the current feedback amplifier circuits with regard to input bias current $I_{bias\_mirror\_gains}$ arising from the mismatch in the gains of the current mirrors, as well as the drift of the input bias currents with temperature, are overcome by the current feedback amplifier circuits and methods of the present invention.

Figure 4:
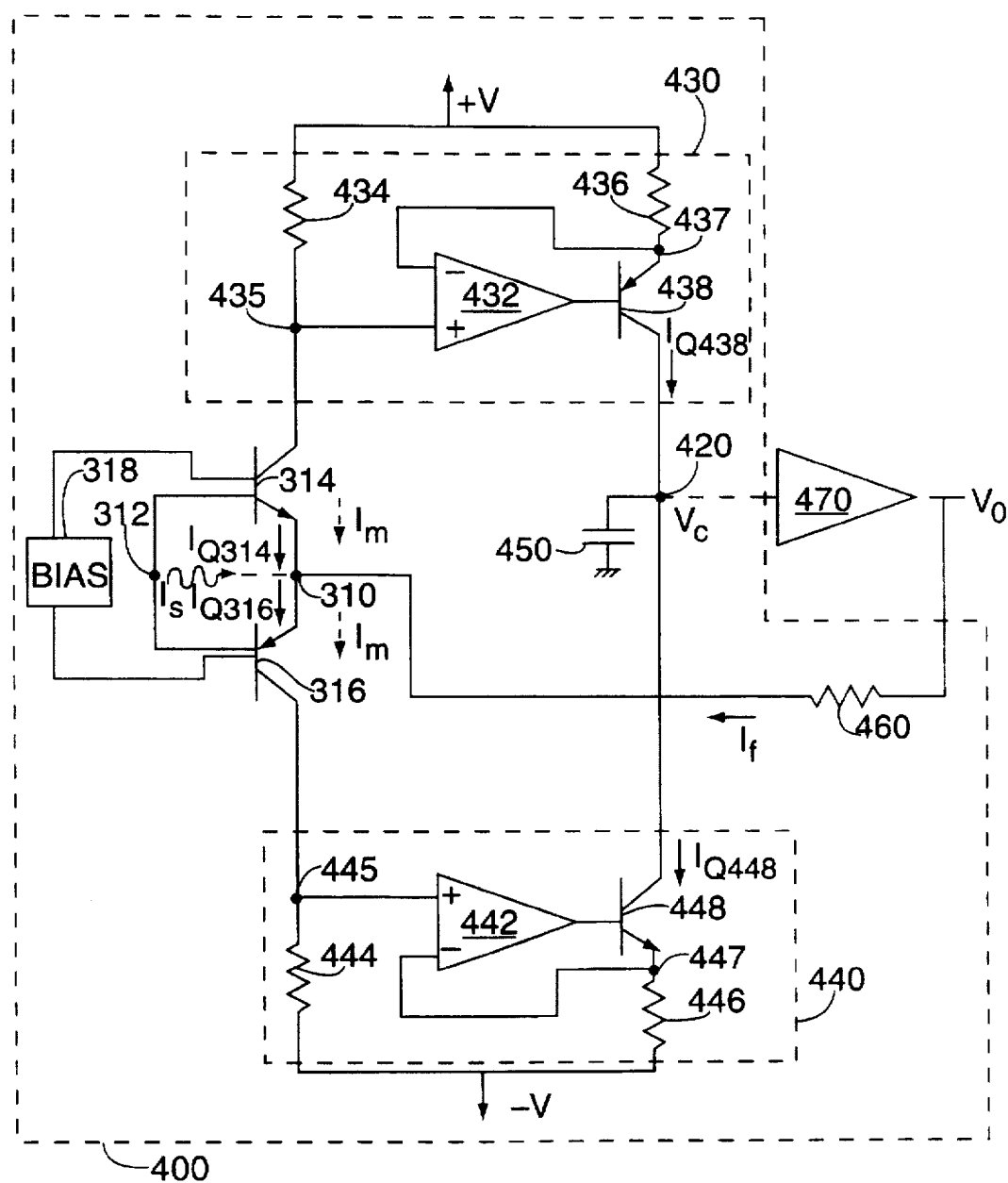
FIG. 4 is schematic diagram of one embodiment of a current-to-voltage converter circuit in accordance with the principles of the present invention, employing a current feedback amplifier with operational amplifier current mirrors.

In accordance with the principles of the present invention, FIG. 4 is a schematic diagram of a fast current feedback amplifier circuit in which the output current maintains high DC accuracy over time and temperature. As described more fully below, FIG. 4 has fast settling time and wide bandwidth. In addition, the circuit shown in FIG. 4 requires no careful feedback capacitance matching. Moreover, the circuit shown by FIG. 4 has lower input bias current than conventional current feedback amplifiers. Further, with proper biasing and in accordance with the principles of the present invention, the input bias current of current feedback amplifier of FIG. 4 also has very low drift.

Referring to FIG. 4, current feedback amplifier circuit 400 includes the following elements which are substantially identical to, and behave in exactly the same way, as the like-numbered elements described with regard to FIG. 3: input terminal 310, non-inverting input terminal 312, NPN-type bipolar junction transistor 314, PNP-type bipolar junction transistor 316, and biasing circuitry 318. As explained with regard to FIG. 3, it will be apparent to those skilled in the art that the input stage is not restricted to this configuration.

In addition, amplifier 400 includes a first current mirror circuit 430 and a second current mirror circuit 440. As discussed in greater detail below, and in accordance with the principles of the present invention, current mirrors 430 and 440 replace current mirrors 330 and 340 of FIG. 3. Accordingly, current mirrors 430 and 440 operate to reflect currents proportional to the currents passing through transistors 314 and 316, $I_{Q314}$ and $I_{Q316}$, and to recombine those reflected currents at node 420. The equivalent capacitance to ground at node 420 is shown in FIG. 4 as internal compensation capacitor 450.

In accordance with the principles of the present invention, current mirror 430 is comprised of op amp 432, resistors 434 and 436, and PNP-type bipolar junction transistor 438. Note that it will be apparent to those skilled in the art that a p-channel MOSFET or JFET may be used in place of bipolar junction transistor 438.

Resistor 434 is coupled to the positive voltage supply at one end. The other end of resistor 434 is coupled, at node 435, to both the collector of transistor 314 and to the non-inverting input of op amp 432. Resistor 436 is coupled to the positive voltage supply at one end. The other end of resistor 436 is coupled, at node 437, to both the inverting input of op amp 432 and to the emitter of transistor 438.

Because of this configuration, the current passing through resistor 434 equals the current passing through transistor 314 ($I_{Q314}$). Op amp 432 operates to drive the voltage at node 437 to be equal to the voltage at node 435, thereby causing the same amount of voltage to be dropped across resistors 434 and 436. Thus, the ratio of the value of resistor 434 to the value of resistor 436 determines the amount of gain of current mirror 430. In addition, op amp 432 controls transistor 438. Accordingly, current mirror 430 reflects a current proportional to the current passing through transistor 314 ($I_{Q314}$) as the current passing through transistor 438 ($I_{Q438}$) which flows into node 420.

Likewise, in accordance with the present invention, current mirror 440 is comprised of op amp 442, resistors 444 and 446, and NPN-type bipolar junction transistor 448. Note that it will be apparent to those skilled in the art that an n-channel MOSFET or JFET may be used in place of bipolar junction transistor 448.

Current mirror 440 is configured and operates in substantially the same manner as current mirror 430. One difference between current mirrors 430 and 440 is that in current mirror 430, current flows from a positive supply through the current mirror, while current in current mirror 440 is pulled through the mirror circuit to a negative supply. Accordingly, current mirror 440 thus reflects a current proportional to the current passing through transistor 316 ($I_{Q316}$) as the current passing through transistor 448 ($I_{Q448}$) which flows out of node 420.

As mentioned above, the equivalent capacitance to ground of node 420 is shown in FIG. 4 as internal compensation capacitor 450, and voltage $V_c$ is developed at node 420.

A negative feedback resistor 460 is provided on FIG. 4, between node 420 and inverting input terminal 310 of current feedback amplifier 400. Thus, when an external signal tries to cause a difference in voltage between inverting input terminal 310 and non-inverting input terminal 312, or if an external signal pushes or pulls current into or out of terminal 310, transistors 314 and 316 begin sourcing and sinking an imbalance current $I_m$, such that the currents passing through transistors 314 and 316 ($I_{Q314}$ and $I_{Q316}$), vary from the quiescent currents, in opposite directions in the amount of imbalance current $I_m$. Currents proportional to the varied currents through transistors 314 and 316 ($I_{Q314}$ and $I_{Q316}$) are conveyed by current mirrors 430 and 440 to internal compensation capacitor 450, causing the voltage at node 420 ($V_c$) to swing and provide a feedback current $I_f$ through feedback resistor 460 until the original imbalance is neutralized via negative feedback.

By applying an input current signal to input terminal 310 of current feedback amplifier 400, and monitoring the voltage at node 420, the circuit may serve as an I/V converter circuit. The input current signal acts as the external signal that causes transistors 314 and 316 to begin sourcing and sinking an imbalance current $I_m$ equal to the input current signal. To accurately drive any circuitry which uses the output voltage of the current feedback amplifier I/V converter, however, an output buffer 470 should be inserted between node 420 and feedback resistor 460, as optionally shown in FIG. 4.

Further examination of FIG. 4 reveals three new sources of input bias current due to operational amplifier current mirrors 430 and 440.

The first source of input bias current in current feedback amplifier 400 due to current mirrors 430 and 440 is the mismatch in the ratio of resistor 434/resistor 436 with the ratio of resistor 444/resistor 446. In other words, an input bias current $I_{bias\_R\_ratio}$ arises in current feedback amplifier 400 of FIG. 4 due to the mismatch of the gains of current mirrors 430 and 440. The absolute value of these resistor ratios themselves is irrelevant to input bias current $I_{bias\_R\_ratio}$.

In a standard integrated circuit process with thin film resistors, resistor ratio matching is typically better than 0.1%. When referred to the inverting input terminal 310, for example, if the current passing through resistor 434 is 50 μA, a 0.1% mismatch in the ratio of resistor 434/resistor 436 with the ratio of resistor 444/resistor 446 causes an input bias current $I_{bias\_R\_ratio}$ of 50 nA.

The next source of input bias current due to current mirrors 430 and 440 is the difference in input offset voltages of op amps 432 and 442. At inverting input terminal 310, the magnitude of this bias current component $I_{bias\_op\_amp\_Vos}$ is the ratio of the difference between the input offset voltages of op amps 432 and 442 ($V_{os\_OA432} - V_{os\_OA442}$) divided by the voltage dropped across resistor 434. Under ideal performance by op amps 432 and 442 with respect to input offset voltages, or where the input offset voltages of the op amps exactly cancel each other out, no input bias current $I_{bias\_op\_amp\_Vos}$ is caused.

Also, in a typical integrated circuit process, the input offset voltages of op amps 432 and 442 should match within +/−2 mV, and a typical voltage drop across resistor 434 is 200 mV. The resulting input bias current $I_{bias\_op\_amp\_Vos}$ caused by the net mismatch of the input offset voltages of operational amplifiers 432 and 442 would thus be 1% of the collector current of input transistors 314 and 316. This is ten times larger than the component of input bias current $I_{bias\_R\_ratio}$ due to the resistor ratio, or gain of the current mirror, mismatch.

The last source of input bias current from current mirrors 430 and 440 is the alpha mismatch of transistors 438 and 448. This bias current component, $I_{bias\_Q438:Q448\_alpha}$, when referred to inverting input terminal 310, is divided by the gain of operational amplifier current mirrors 430 and 440. If JFETs or MOSFETs are used in place of bipolar junction transistors 438 and 448, there is no alpha mismatch, and thus no bias current component $I_{bias\_Q438:Q448\_alpha}$.

Figure 5:
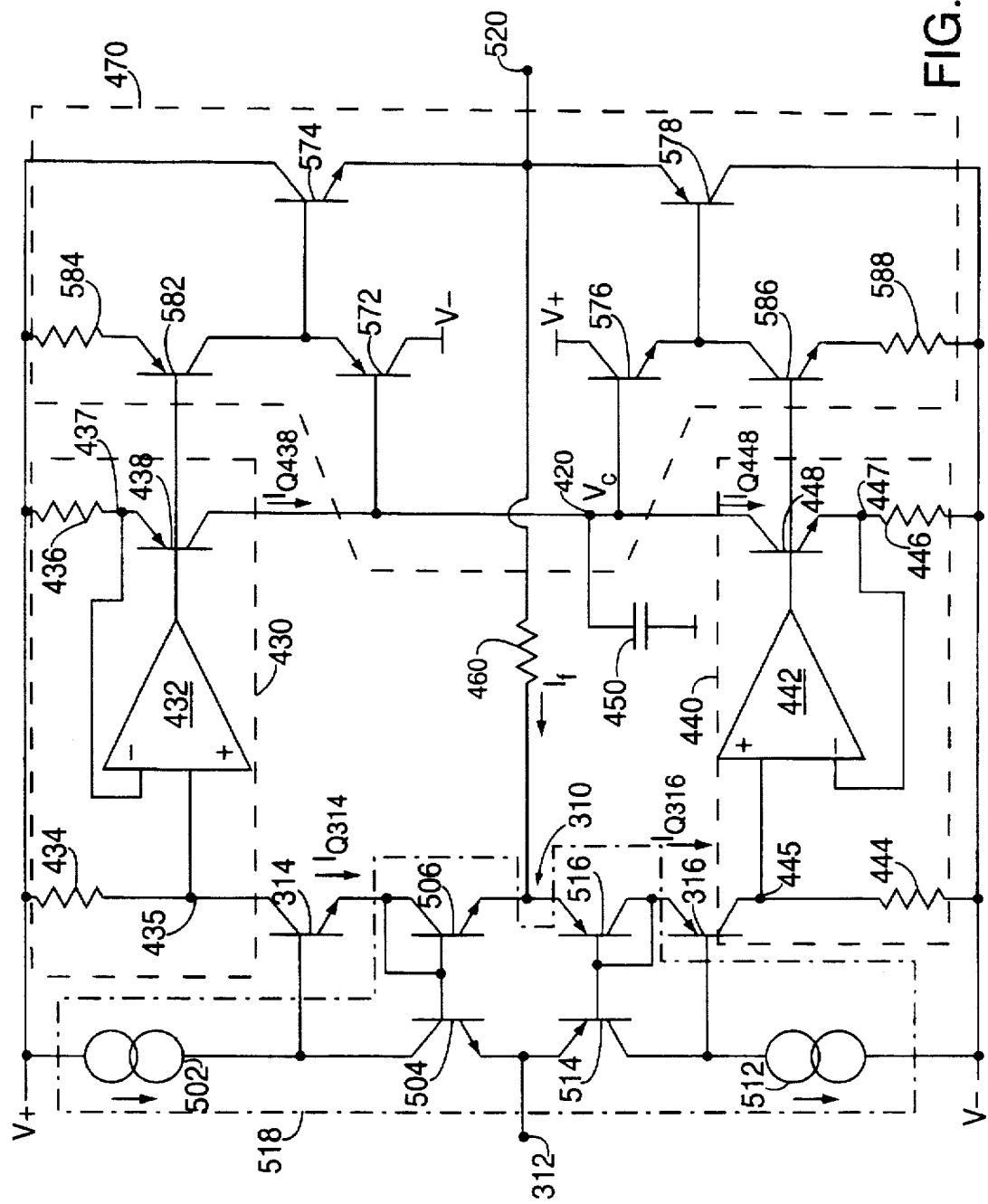
FIG. 5 is a schematic diagram of a preferred embodiment of a current-to-voltage converter circuit constructed in accordance with the principles of the present invention, employing a current feedback amplifier with operational amplifier current mirrors.

Further, if the preferred embodiment shown in FIG. 5 is used, the alpha errors of transistors 438 and 448, and corresponding input bias current component $I_{bias\_Q438:Q448\_alpha}$, are substantially eliminated. Thus, only the mismatch in beta between two similar transistors causes input bias current by transistors 438 and 448.

FIG. 5 is a schematic diagram of a preferred embodiment of a current-to-voltage converter circuit constructed in accordance with the principles of the present invention, employing a current feedback amplifier with operational amplifier current mirrors.

Referring to FIG. 5, the following elements are substantially identical to, and are coupled and behave in substantially the same way as, the like-numbered elements described above with regard to FIGS. 3 and 4: input terminal 310, non-inverting input terminal 312, NPN-type bipolar junction transistor 314, and PNP-type bipolar junction transistor 316.

Biasing circuitry 518, is shown on FIG. 5 as two Wilson current mirrors. The first Wilson current mirror is comprised of current source 502, transistors 504 and 506, in connection with input transistor 314, which establishes a quiescent current passing through transistor 314. Likewise, current source 512, transistors 514 and 516, in connection with input transistor 316, comprise the second Wilson current mirror which establishes a quiescent current through transistor 316.

As mentioned above with regard to FIG. 3, by employing Wilson current mirrors as the biasing circuitry for transistors 314 and 316, the alpha error input bias current $I_{bias\_Q314:Q316\_alpha}$, caused by mismatch of the alphas of transistors 314 and 316, is first order eliminated. Accordingly, only the mismatching of beta between similar types of transistors generates an input bias current caused by transistors 314 and 316.

As discussed above, in a typical integrated circuit process, the beta matching of identical transistors is typically better than 5%. Assuming a typical beta of 200 and a worst case 5% mismatch, for example, if transistor 314 and one of the transistors of its Wilson current mirror mismatch in betas by 5%, and all the other transistors are perfectly matched, the beta mismatch error input bias current caused by transistors 314 and 316, is 0.024% of the collector currents.

FIG. 5 additionally shows the operational amplifier current mirrors 430 and 440 of FIG. 4, which operate to reflect currents proportional to the currents passing through transistors 314 and 316 ($I_{Q314}$ and $I_{Q316}$, respectively), and to recombine those reflected currents at node 420.

Also, in FIG. 5, the equivalent capacitance to ground of node 420 is shown as internal compensation capacitor 450, as it was shown in FIG. 4. Likewise, voltage $V_c$ is developed by internal compensation capacitor 450 in response to $I_{C450}$, as described more fully below.

FIG. 5 also shows output buffer 470 between node 420 and negative feedback resistor 460. Output buffer 470 is comprised of transistors 572, 574, 576, and 578, and operates to produce the voltage $V_c$ at Output node 520. Similar to FIG. 4, negative feedback resistor 460 is provided in FIG. 5, between output node 520 and inverting input terminal 310.

The circuit of FIG. 5 operates substantially the same as the circuit of FIG. 4—i.e., when an external signal tries to cause a difference in voltage between input terminal 310 and input terminal 312, or if an external signal pushes or pulls current into or out of terminal 310, transistors 314 and 316 begin sourcing and sinking an imbalance current $I_m$, such that the currents passing through transistors 314 and 316 ($I_{Q314}$ and $I_{Q316}$) vary from the quiescent currents in opposite directions in the amount of imbalance current $I_m$. Currents proportional to the varied currents through transistors 314 and 316 ($I_{Q314}$ and $I_{Q316}$) are conveyed by current mirrors 430 and 440, as the currents through transistors 438 and 448 ($I_{Q438}$ and $I_{Q448}$). These currents are conveyed to internal compensation capacitor 450, causing the voltage $V_c$ at node 420 to swing. Voltage $V_c$ is produced by buffer 470 at output node 520, which provides a feedback current $I_f$ through feedback resistor 460 until the original imbalance is neutralized via negative feedback.

In addition on FIG. 5, transistors 582 and 586 and resistors 584 and 588 operate to substantially reduce the last source of input bias current from operational amplifier current mirrors 430 and 440—i.e., the alpha mismatch of transistors 438 and 448. In the circuit of FIG. 4, this input bias current component ($I_{bias\_Q438:Q448\_alpha}$) results from the fact that the currents passing through the collectors of transistors 438 and 448 are slightly lower than their emitter currents.

One difference in respective collector currents of transistors 314 and 316, from respective emitter currents, is owing to the respective base currents of transistors 438 and 448. Transistors 572 and 582 are like in type to transistor 438. Similarly, transistors 576 and 586 are like in type to transistor 448. By selecting the values of resistors 584 and 588 to equal the values of resistors 436 and 446, the emitter currents (and the base currents) of transistors 582 and 586 are the same as the emitter currents of transistors 438 and 448. Further, except for a small difference owing to the base currents of transistors 574 and 578 (of buffer 470), the base currents of transistors 572 and 576 (of buffer 470) are the same as the base currents of transistors 438 and 448. Thus, in the configuration shown by FIG. 5, the alpha errors of transistors 438 and 448, and thus input bias current component $I_{bias\_Q438:Q448\_alpha}$ caused thereby, are first order cancelled by the base currents of transistors 572 and 576.

In the configuration of FIG. 5, $I_{bias\_Q438:Q448\_alpha}$ is therefore reduced to roughly the beta matching of identical transistors, which is 0.024% of the collector current of the input transistors 314 and 316.

In addition, as in FIG. 4, the inverting input bias current $I_{bias\_R\_ratio}$ arising in FIG. 5 due to the mismatch of the gains of current mirrors 430 and 440 is 0.1% of the collector current of input transistors 314 and 316. Similarly as in FIG. 4, the resulting input bias current $I_{bias\_op\_amp\_Vos}$ caused by the net mismatch of the input offset voltages of operational amplifiers 432 and 442 is 1% of the collector current of the input transistors 314 and 316.

Thus, in accordance with the principles of the present invention, the current feedback amplifier using operational amplifier current mirrors reduces the inverting input bias current to about 1% of the collector current. As such, the input bias current is comparable to that of a voltage feedback operational amplifier with bipolar junction input transistors.

Additionally, in accordance with the principles of the present invention, the drift of the input bias current of the invented current feedback amplifier may be made very predictable, and substantially reduced.

The mismatch in resistor ratios, or gains, of the operational amplifier current mirrors 430 and 440 generates input bias current $I_{bias\_R\_ratio}$ with drift with temperature having the same temperature coefficient as that of the collector currents in transistors 314 and 316. This is because this bias current component actually shows up as a portion of a collector current.

Similarly, as is well known in the art, the operational amplifier input offset voltages generate bias current $I_{bias\_op\_amp\_Vos}$ due to differences in $V_{be}$'s of transistors. Thus, $I_{bias\_op\_amp\_Vos}$ has a temperature coefficient of exactly delta $V_{be}$ divided by a resistance. This is known as Proportional To Absolute Temperature or "PTAT".

If the quiescent collector currents of transistors 314 and 316 are also biased to be PTAT, then the drift of the total inverting input current is very near to PTAT. The only remaining input bias current component, $I_{bias\_Q438:Q448\_alpha}$, was reduced to roughly a bias current due to base current mismatching of identical transistors. As such, the temperature coefficient of $I_{bias\_Q438:Q448\_alpha}$ is not well defined. However, this is the smallest bias current component, only 0.024% of the collector current of input transistors 314 and 316, and is non-existent if MOSFETs or JFETs are used instead of bipolar junction transistors 438 and 448 (and for transistors 572 and 576, if present).

Furthermore, in accordance with the principles of the present invention, the drift with temperature of the input bias current of the invented current feedback amplifier may be made virtually irrelevant. If the offset voltage of one of the op amps 432 or 442 is initially adjusted until the bias current at inverting input terminal 310 is zero, that bias current remains at roughly zero. This is because the main bias current components, $I_{bias\_op\_amp\_Vos}$ and $I_{bias\_R\_ratio}$, both have a temperature coefficient of PTAT. If this were not so, then attempting to initially trim the offset voltages of one of op amps 432 or 442 in this way would not work to reduce the problem of drift. This is because the trimming would unintentionally trim out bias current $I_{bias\_R\_ratio}$ due to the mismatch of the gains of current mirrors 430 and 440. Accordingly, not only would $I_{bias\_R\_ratio}$ still drift with temperature, but the offset voltages of the op amps 432 and 442 would not have been trimmed to exactly cancel each other out. Thus, $I_{bias\_op\_amp\_Vos}$ would still drift with temperature.

A further advantage of trimming the offset of op amps 432 and 442 rather than the gain of current mirrors 430 and 440 results. As explained with regard to FIG. 6 below, the resistors that trim the offset of op amps 432 and 442 are not in the signal path of the current feedback amplifier. Thus, the extra area of resistance for trimming, and the accompanying capacitance, is kept out of the current feedback amplifier signal path. Furthermore, changes in the gains of current mirrors 430 and 440 involve changing the values of resistors 434, 436, 444, or 446, which effect input bias current $I_{bias\_R\_ratio}$.

Following the teachings of the present invention, it is not necessary to actually know the input offset voltage of either op amp in order to eliminate the drift caused by them. It is only necessary to trim their offsets so that the bias current at inverting input terminal 310 is zero. This necessarily trims out both $I_{bias\_R\_ratio}$ and $I_{bias\_op\_amp\_Vos}$ and their drifts with temperature.

Figure 6:
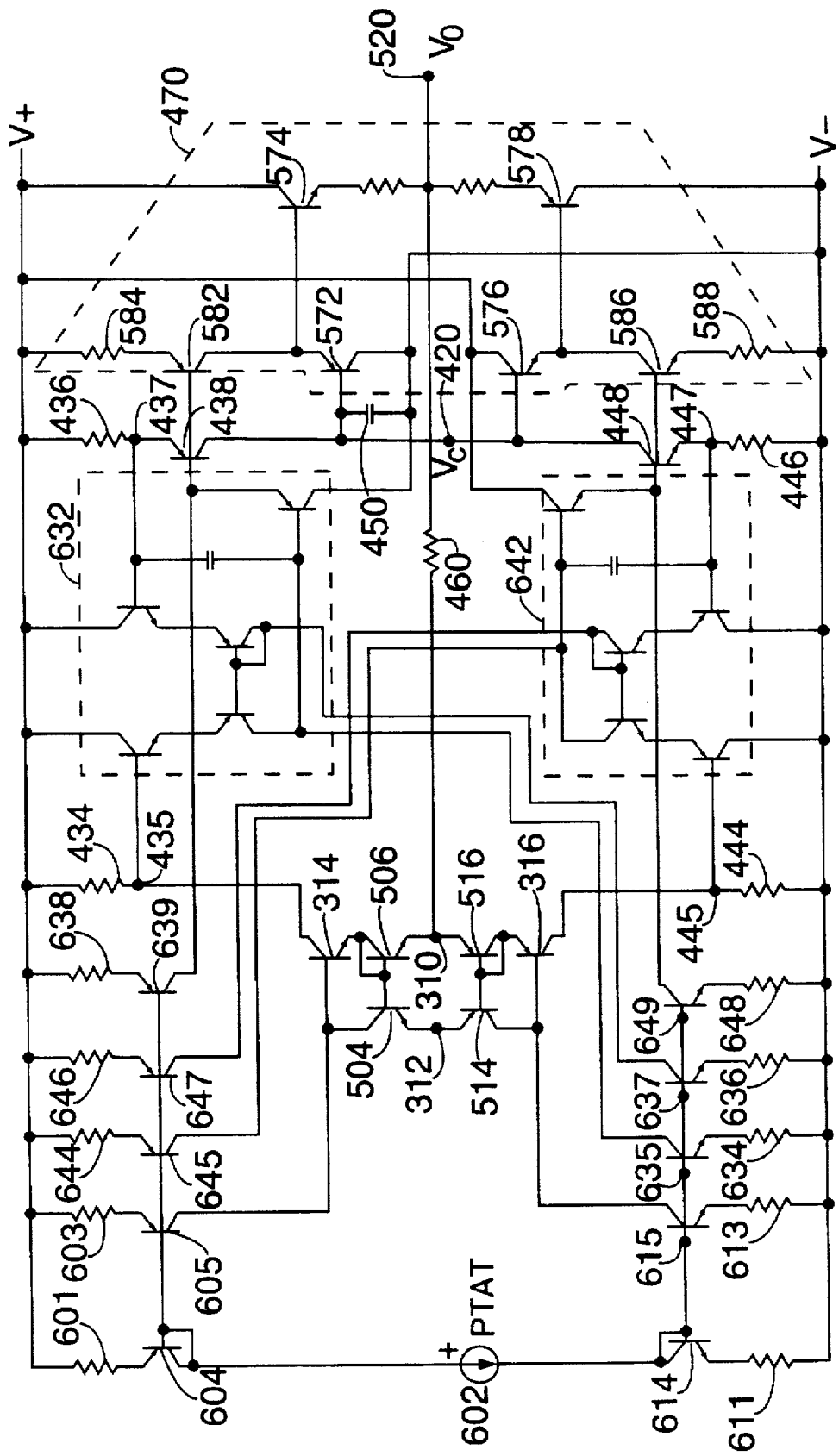
FIG. 6 is a schematic diagram of another preferred embodiment of a current-to-voltage converter circuit and method constructed in accordance with the principles of the present invention, employing a current feedback amplifier with operational amplifier current mirrors.

FIG. 6 further illustrates these principles, and their benefits. FIG. 6 is a schematic diagram of another preferred embodiment of a current-to-voltage converter circuit constructed in accordance with the principles of the present invention, employing the current feedback amplifier with operational amplifier current mirrors of the present invention.

Referring to FIG. 6, elements 310, 312, 314, and 316 operate substantially as described above in connection with FIGS. 3–5. Resistors 601, 603, 611 and 613, and transistors 604, 605, 614 and 615, and current source 602 operate to provide the reference current supplies 502 and 512 of FIG. 5, and to provide PTAT current sources as that reference current. Elements 434, 435, 436, 437, 438, 444, 445, 446, 447, 448, 450, 460 and 470 operate substantially as described in connection with FIGS. 4 and 5.

Op amp 432 of FIGS. 4 and 5 is comprised of signal portion 632, biasing resistors 634, 636 and 638, and biasing transistors 635, 637 and 639. Op amp 442 of FIGS. 4 and 5 is likewise comprised of elements 642, 644–649 (as described above with respect to op amp 432). Elements 504, 506, 514, 516, 520, 574, 576, 578, 582, 584, 586, and 588 operate substantially as described in connection with FIG. 5.

Resistors 601 and 611 trim the input offset voltage of the current feedback amplifier, as well as the drift thereof.

Resistors 634 and 636 trim the offset voltage of op amp 632, and resistors 644 and 646 trim the offset voltage of op amp 642.

As shown in FIG. 6, resistor 634, 636, 644 and 646 are not in the signal path of the current feedback amplifier.

Figure 7:
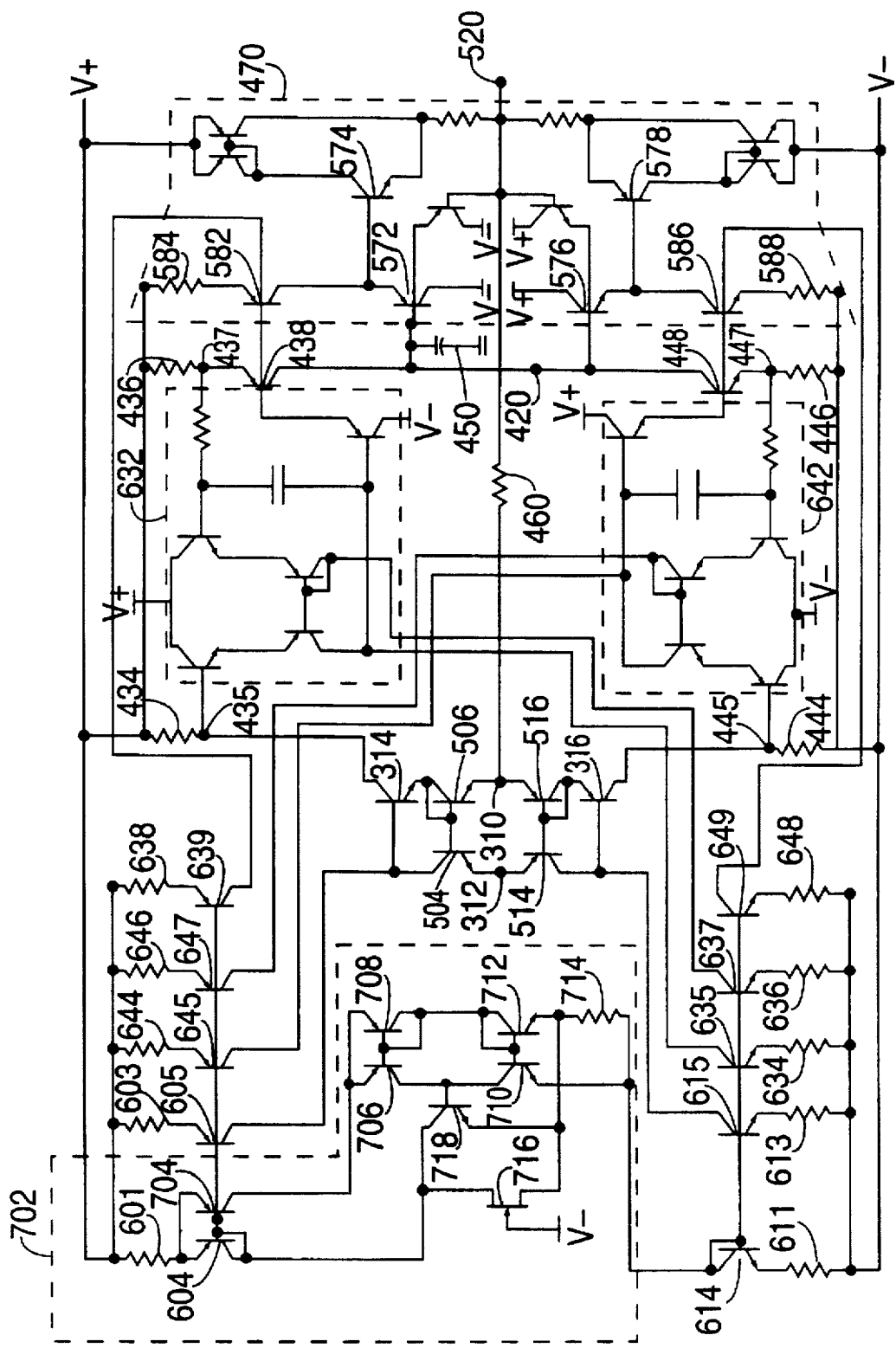
FIG. 7 is a schematic diagram of still another preferred embodiment of a current-to-voltage converter circuit and method constructed in accordance with the principles of the present invention, employing the current feedback amplifier and method with operational amplifier current mirrors of the present invention.

FIG. 7 provides further illustration in accordance with the invention. FIG. 7 is a schematic diagram of still another preferred embodiment of a current-to-voltage converter circuit constructed in accordance with the principles of the present invention, employing the current feedback amplifier with operational amplifier current mirrors of the present invention.

Referring to FIG. 7, elements 310, 312, 314, and 316 operate substantially as described above in connection with FIGS. 3–6. Resistors 601, 603, 611 and 613, and transistors 604, 605, 614 and 615 and current source 702 (discussed in more detail below) operate substantially as described above in connection with FIG. 6 to provide PTAT reference current. Elements 434, 435, 436, 437, 438, 444, 445, 446, 447, 448, 450, 460 and 470 operate substantially as described above in connection with FIGS. 4–6.

Op amp 432 of FIGS. 4 and 5 is comprised of signal portion 632, biasing resistors 634, 636 and 638, and biasing transistors 635, 637 and 639, substantially as described above in connection with FIG. 6. Op amp 442 of FIGS. 4 and 5 is likewise comprised of elements 642, 644–649, substantially as described above in connection with FIG. 6. Elements 504, 506, 514, 516, 520, 572, 574, 576, 578, 582, 584, 586, and 588 operate substantially as described above in connection with FIGS. 5 and 6.

In FIG. 7, current source 702 operates as the current source 602 of FIG. 6, to generate PTAT reference current to input transistors 314 and 316. Current source 702 includes a first current mirror current source, comprised of diode-connected transistor 604, transistor 704, and resistor 601. Current source 702 also includes a second current mirror comprised of transistor 706 and diode-connected transistor 708; and a third current mirror comprised of transistor 710 and diode-connected transistor 712.

In this third current mirror, the area of the emitter of transistor 712 is larger than the emitter of transistor 710. This means that a delta $V_{be}$ is created. Additionally, one end of resistor 714 is coupled to the emitter of transistor 712, and the other end of resistor 714 is coupled to the emitter of transistor 710. The resultant $V_{be}$ is dropped across resistor 714, providing a current that is PTAT. Thus, PTAT current source 702 is thereby formed for biasing input transistors 314 and 316.

In a typical circuit, the area of the emitter of transistor 712 is about ten times larger than the emitter of transistor 710, and the value of resistor 714 is about 800 ohms, such that a 50 μA current results in transistor 604.

Current source 702 also includes JFET 716. JFET 716 ensures that current source 702 starts. Transistor 718 provides a feedback signal to ensure that the currents passing through transistors 706, 708, 710 and 712 are equal.

Finally, an advantage exists in having a higher current gain in the operational amplifier current mirrors 430 and 440. That advantage is that it reduces the apparent size of the internal compensation capacitor 450. In other words, a larger feedback resistor 460 for a given internal compensation capacitor 450 and bandwidth may be used.

Figure 8:
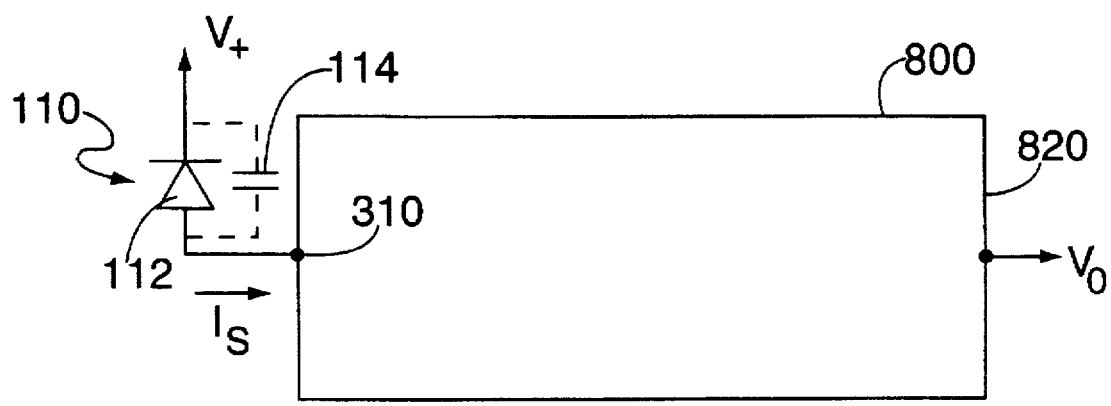
FIG. 8 is a schematic diagram of an optical storage accessing circuit which may employ any of the current-to-voltage converter circuits of FIGS. 4–7, constructed in accordance with the principles of the present invention.

FIG. 8 is a simplified schematic diagram of an optical storage accessing circuit to employ, as element 800, any of the circuits shown in FIGS. 4–7. In FIG. 8, elements 110, 112, and 114 are substantially identical to, and behave in exactly the same way, as the like-numbered elements described above with regard to FIG. 1. Photo diode current input signal $I_s$ is provided at inverting input terminal 310 (and, as before, is indicated with an arbitrary direction), and causes the voltage $V_o$ of node 820 to vary. In a typical optical storage accessing circuit, four to eight photo diodes may be used.

It will be apparent to those of ordinary skill in the art that although the present invention has been discussed above with reference to FIGS. 4–8, wherein the input transistors comprise push-pull (PNP and NPN) bipolar junction transistors, the present invention is applicable to other configurations and types of input devices as well.

For example, MOSFETs or JFETs may be employed. It will be further apparent n-channel MOSFETs or JFETs may be used in place of NPN-type bipolar junction transistors, and a p-channel MOSFETs or JFETs may be used in place of a PNP-type bipolar junction transistors.

In addition, although Wilson current mirrors were discussed for biasing the input transistors, other means for performing that biasing to reduce the alpha errors of the input transistors are also available.

Persons skilled in the art will appreciate that other circuits exist for providing a buffer, and for providing compensation for the alpha errors of the output transistors of the operational amplifier current mirrors or for eliminating those alpha errors by using MOSFETs or JFETs.

It will also be apparent that although the present invention has been discussed above with reference to a current feedback amplifier for providing current to voltage conversion, other uses for such current feedback amplifiers are also available.

Persons skilled in the art will thus appreciate that the present invention can be practiced by other than the described embodiments, which are presented for purposes of illustration and not of limitation, and thus the present invention is limited only by the claims which follow.

What is claimed is:

1. A current feedback amplifier circuit comprising:
   an input terminal being adapted to receive an input signal and a feedback signal;
   an output terminal coupled to the input terminal to provide the feedback signal;
   first and second input transistors coupled together and to the input terminal;
   biasing circuitry coupled to the first and second input transistors, the biasing circuitry establishing first and second quiescent currents through the first and second input transistors, respectively, the first and second input transistors passing current which varies in response to the input signal;
   first and second operational amplifier current mirror circuits having matching gain and being coupled to the first and second input transistors, one of the first and second operational amplifier current mirror circuits having an offset voltage trimmed to match the offset voltage of the other of the first and second operational amplifier current mirror circuits such that input bias current component at the input terminal due to mismatching between the first and second current mirror circuits approaches zero, the first and second current mirror circuits providing first and second mirrored currents which are substantially proportional to quiescent currents passing through the first and second input transistors, respectively, the current mirror circuits being coupled to the output terminal, the mirrored currents providing an output signal at the output terminal, the output signal providing the feedback signal; and first and second supply terminals, coupled to positive and negative voltage supplies respectively, the first supply terminal coupled to the first operational amplifier current mirror circuit, the second supply terminal coupled to the second operational amplifier current mirror circuit, and the first and second supply terminals also being coupled to the biasing circuit.

2. The amplifier circuit of claim 1, wherein the first and second input transistors, the biasing circuitry, and the first and second operational amplifier current mirrors comprise a single integrated circuit.

3. The amplifier circuit of claim 1, wherein the first and second input transistors are NPN- and PNP-type bipolar junction transistors, respectively, the first and second transistors having their emitters coupled together and to the input terminal.

4. The amplifier circuit of claim 1, wherein the first and second input transistors are n-channel and p-channel field effect transistors, respectively, the first and second transistors having their sources coupled together and to the input terminal.

5. The amplifier circuit of claim 1, wherein the first and second input transistors are included within the biasing circuitry, the biasing circuitry further comprising:

a first bias circuit for biasing the first input transistor, the first bias circuit establishing the first quiescent current in the first input transistor; and a second bias circuit for biasing the second input transistor, the second bias circuit establishing the second quiescent current in the second input transistor.

6. The amplifier circuit of claim 1, wherein the biasing circuitry further comprises at least one Wilson current mirror circuit.

7. The amplifier circuit of claim 1, wherein the biasing circuitry includes a current source providing current proportional to absolute temperature such that drift due to temperature in said biasing circuitry approaches drift due to temperature in the first and second operational amplifier current mirror circuits.

8. The amplifier circuit of claim 1, wherein the first and second operational amplifier current mirror circuits each have a current gain of unity.

9. The amplifier circuit of claim 1, wherein the first and second operational amplifier current mirror circuits each have a current gain greater than unity.

10. The amplifier circuit of claim 1, wherein each of the first and second operational amplifier current mirror circuits comprises:

an operational amplifier having an inverting input, a noninverting input coupled to a selected one of the first and second input transistors, and an output;

an output transistor having first, second and third terminals, the first terminal of the output transistor being coupled to the operational amplifier output, the second terminal of the output transistor being coupled to the operational amplifier inverting input, and the third terminal of the output transistor being coupled to the output terminal;

first and second gain resistors, each having a first end coupled to a selected one of the first and second supply terminals and to each other, the first resistor having a second end coupled to the noninverting input of the operational amplifier, the second resistor having a second end coupled to the output transistor, the first and second mirrored currents being provided at the third end of the output transistors of the first and second operational amplifier current mirror circuits, respectively.

11. The amplifier circuit of claim 10, wherein the output transistors of the first and second operational amplifier current mirror circuits are PNP-type and NPN-type bipolar junction transistors, respectively, and the first terminal of each output transistor is a base, the second terminal of each output transistor is an emitter, and the third terminal of each output transistor is a collector.

12. The amplifier circuit of claim 10, wherein the output transistors of the first and second operational amplifier current mirror circuits are p-channel and n-channel field effect transistors, respectively, and the first terminal of each output transistor is a gate, the second terminal of each output transistor is a source, and the third terminal of each output transistor is a drain.

13. The amplifier circuit of claim 10, further comprising an output compensation circuit which substantially compensates for mismatch in alpha of the output transistors of the first and second operational amplifier current mirror circuits.

14. The amplifier circuit of claim 13, wherein the output compensation circuit comprises:

a first compensation circuit which compensates the output transistor of the first operational amplifier current mirror circuit; and a second compensation circuit which compensates the output transistor of the second operational amplifier current mirror circuit.

15. The amplifier circuit of claim 14, wherein the first compensation circuit comprises:

a first compensation resistor having first and second ends and a resistance value equal to the second resistor of the first operational amplifier current mirror circuit, the first end of the resistor being coupled to the selected supply terminal;

first and second PNP transistors, each having an emitter, a base and a collector, the emitter of the first PNP transistor being coupled to the second end of the first compensation resistor, the base of the first PNP transistor being coupled to the output of the operational amplifier of the first operational amplifier current mirror circuit, the collector of the first PNP transistor being coupled to the emitter of the second PNP transistor, the base of the second PNP transistor being coupled to the collector of the output transistor of the first operational amplifier current mirror circuit, and the collector of the second PNP transistor being coupled to the nonselected supply terminal, the second PNP transistor having a base current which compensates for the output current of the first operational amplifier current mirror circuit.

16. The amplifier circuit of claim 15, wherein the second compensation circuit comprises:

a second compensation resistor having first and second ends and a resistance value equal to the second resistor of the second operational amplifier current mirror circuit, the first end of the resistor being coupled to the nonselected supply terminal;

first and second NPN transistors, each having an emitter, a base and a collector, the emitter of the first NPN transistor being coupled to the second end of the second compensation resistor, the base of the first NPN transistor being coupled to the output of the operational amplifier of the second operational amplifier current mirror circuit, the collector of the first NPN transistor being coupled to the emitter of the second NPN transistor, the base of the second NPN transistor being coupled to the collector of the output transistor of the second operational amplifier current mirror circuit, and the collector of the second NPN transistor being coupled to the selected supply terminal, the second NPN transistor having a base current which compensates for the output current of the second operational amplifier current mirror circuit.

17. The amplifier circuit of claim 14, wherein the second compensation circuit comprises:

a compensation resistor having first and second ends and a resistance value equal to the second resistor of the second operational amplifier current mirror circuit, the first end of the compensation resistor being coupled to the nonselected supply terminal;

first and second NPN transistors, each having an emitter, a base and a collector, the emitter of the first NPN transistor being coupled to the second end of the compensation resistor, the base of the first NPN transistor being coupled to the output of the operational amplifier of the second operational amplifier current mirror circuit, the collector of the first NPN transistor being coupled to the emitter of the second NPN transistor, the base of the second NPN transistor being coupled to the collector of the output transistor of the second operational amplifier current mirror circuit, and the collector of the second NPN transistor being coupled to the selected supply terminal, the second NPN transistor having a base current which compensates for the output current of the second operational amplifier current mirror circuit.

18. The amplifier circuit of claim 13, wherein the first and second input transistors, the biasing circuitry, the first and second operational amplifier current mirrors, and the output compensation circuit comprise a single integrated circuit.

19. The amplifier circuit of claim 1, further comprising a buffer circuit having an input and an output, the buffer circuit input being coupled to the first and second operational amplifier current mirror circuits, to the output terminal, and to the first and second supply terminals, the buffer circuit providing the output signal to the buffer circuit output, the buffer circuit output providing the feedback signal.

20. The amplifier circuit of claim 19, wherein the first and second input transistors, the biasing circuitry, the first and second operational amplifier current mirrors, and the buffer circuit comprise a single integrated circuit.

21. The amplifier circuit of claim 13, wherein the output compensation circuit further comprises a buffer circuit having an input and an output, the buffer circuit input being coupled to the third ends of the output transistors of the first and second operational amplifier current mirror circuits, the buffer circuit providing the output signal to the buffer circuit output, the buffer circuit output providing the feedback signal.

22. The amplifier circuit of claim 14, wherein the first and second compensation circuits further comprise a buffer circuit having an input and an output, the buffer circuit input being coupled to the third ends of the output transistors of the first and second operational amplifier current mirror circuits, the buffer circuit providing the output signal to the buffer circuit output, the buffer circuit output providing the feedback signal.

23. The amplifier circuit of claim 22, wherein the first compensation circuit comprises:

a first compensation resistor having first and second ends and a resistance value equal to the second resistor of the first operational amplifier current mirror circuit, the first end of the resistor being coupled to the selected supply terminal;

first and second PNP transistors, each having an emitter, a base and a collector, the emitter of the first PNP transistor being coupled to the second end of the first compensation resistor, the base of the first PNP transistor being coupled to the output of the operational amplifier of the first operational amplifier current mirror circuit, the collector of the first PNP transistor being coupled to the emitter of the second PNP transistor, the base of the second PNP transistor being coupled to the collector of the output transistor of the first operational amplifier current mirror circuit, and the collector of the second PNP transistor being coupled to the nonselected supply terminal, the second PNP transistor having a base current which compensates for the output current of the first operational amplifier current mirror circuit.

24. The amplifier circuit of claim 23, wherein the second compensation circuit comprises:

a second compensation resistor having first and second ends and a resistance value equal to the second resistor of the second operational amplifier current mirror circuit, the first end of the resistor being coupled to the nonselected supply terminal;

first and second NPN transistors, each having an emitter, a base and a collector, the emitter of the first NPN transistor being coupled to the second end of the second compensation resistor, the base of the first NPN transistor being coupled to the output of the operational amplifier of the second operational amplifier current mirror circuit, the collector of the first NPN transistor being coupled to the emitter of the second NPN transistor, the base of the second NPN transistor being coupled to the collector of the output transistor of the second operational amplifier current mirror circuit, and the collector of the second NPN transistor being coupled to the selected supply terminal, the second NPN transistor having a base current which compensates for the output current of the second operational amplifier current mirror circuit.

25. The amplifier circuit of claim 22, wherein the second compensation circuit comprises:

a compensation resistor having first and second ends and a resistance value equal to the second resistor of the second operational amplifier current mirror circuit, the first end of the compensation resistor being coupled to the nonselected supply terminal;

first and second NPN transistors, each having an emitter, a base and a collector, the emitter of the first NPN transistor being coupled to the second end of the compensation resistor, the base of the first NPN transistor being coupled to the output of the operational amplifier of the second operational amplifier current mirror circuit, the collector of the first NPN transistor being coupled to the emitter of the second NPN transistor, the base of the second NPN transistor being coupled to the collector of the output transistor of the second operational amplifier current mirror circuit, and the collector of the second NPN transistor being coupled to the selected supply terminal, the second NPN transistor having a base current which compensates for the output current of the second operational amplifier current mirror circuit.

21

26. The amplifier circuit of claim 21, wherein the first and second input transistors, the biasing circuitry, the first and second operational amplifier current mirrors, the output compensation circuit; and the buffer circuit comprise a single integrated circuit.

27. The amplifier circuit of claim 1, further comprising a feedback resistor having first and second ends, the first end of the feedback resistor being coupled to the output terminal and the second end of the feedback resistor being coupled to the input terminal.

28. The amplifier circuit of claim 27, wherein the first and second input transistors, the biasing circuitry, the first and second operational amplifier current mirrors, and the feedback resistor comprise a single integrated circuit.

29. The amplifier circuit of claim 19, further comprising a feedback resistor having first and second ends, the first end of the feedback resistor being coupled to the buffer circuit output and the second end of the feedback resistor being coupled to the input terminal.

30. The amplifier circuit of claim 29, wherein the first and second input transistors, the biasing circuitry, the first and second operational amplifier current mirrors, the buffer circuit, and the feedback resistor comprise a single integrated circuit.

31. The amplifier circuit of claim 21, further comprising a feedback resistor having first and second ends, the first end of the feedback resistor being coupled to the buffer circuit output and the second end of the feedback resistor being coupled to the input terminal.

32. The amplifier circuit of claim 31, wherein the first and second input transistors, the biasing circuitry, the first and second operational amplifier current mirrors, the output compensation circuit, the buffer circuit, and the feedback resistor comprise a single integrated circuit.

33. The amplifier circuit of claim 7, wherein the current source providing current proportional to absolute temperature comprises:

a first current mirror circuit having first and second bipolar junction transistors, each transistor having a base, an emitter and a collector, and each transistor having a different base-emitter area, the bases of the first and second transistors being coupled together, and the collector of the second transistor being coupled to the bases of the first and second transistors;

a second current mirror circuit having third and fourth bipolar junction transistors, each transistor having a base, an emitter and a collector, and each transistor having substantially equal base-emitter areas, the bases of the third and fourth transistors being coupled together, and the collector of the fourth transistor being coupled to the bases of the third and fourth transistors, the collectors of the first and third transistors being coupled together and the collectors of the second and fourth transistors being coupled together;

a fifth transistor having a base coupled to the collectors of the first and third transistors, and an emitter coupled to the emitter of the second transistor;

a resistor having first and second ends, the resistor being coupled at the first end to the emitter of the first transistor, and the resistor being coupled at the second end to the emitter of the second transistor; and biasing circuitry coupled to the emitters of the third and fourth transistors, and also coupled to the collector of the fifth transistor, which establishes quiescent currents in the first, second, third and fourth transistors, the different base-emitter areas of the first and second transistors developing a voltage difference, the voltage difference providing a proportional to absolute temperature current in the emitter of the second transistor.

34. The amplifier circuit of claim 33, wherein the current source providing current proportional to absolute temperature further comprises a start-up circuit.

35. The amplifier circuit of claim 34, wherein the start-up circuit comprises a junction field effect transistor.

36. The amplifier circuit of claim 1, wherein the amplifier circuit converts an input current to an output voltage.

37. The amplifier circuit of claim 10, wherein the amplifier circuit converts an input current to an output voltage.

38. The amplifier circuit of claim 13, wherein the amplifier circuit converts an input current to an output voltage.

39. The amplifier circuit of claim 19, wherein the amplifier circuit converts an input current to an output voltage.

40. The amplifier circuit of claim 21, wherein the amplifier circuit converts an input current to an output voltage.

41. The amplifier circuit of claim 40, wherein the output compensation circuit and the buffer circuit are not independent.

42. The amplifier circuit of claim 36, wherein the biasing circuitry includes a current source providing current proportional to absolute temperature.

43. A method of providing current feedback amplification, the method comprising the steps of:

biasing an input node with a known current source, the current source providing current which is proportional to absolute temperature;

monitoring the input node for an input signal;

generating an imbalance current in response to the input signal;

reflecting a current substantially proportional to the imbalance current to an output node by utilizing first and second operational amplifier current mirror circuits, wherein one of the first and second operational amplifier current mirror circuits has an offset voltage trimmed to match the offset voltage of the other of the first and second operational amplifier current mirror circuits such that input current due to mismatching between the first and second current mirror circuits approaches zero;

providing a feedback signal to the input node in response to the imbalance current at the output node; and repeating the steps of generating, reflecting and providing until the input signal is compensated for.

44. The method of claim 43, further comprising the steps of:

setting bias current proportional to absolute temperature; and trimming bias current at the input node to substantially zero prior to monitoring the input node.

45. The method of claim 44, wherein the step of trimming bias current is independent of the steps of monitoring, generating, reflecting, providing and repeating.

46. The method of claim 44, further comprising the step of trimming input offset voltage.

47. An optical storage accessing circuit for converting an input current from a photodiode to an output voltage, the photo diode generating an input current signal in response to detection of light, the circuit comprising:

first and second supply terminals being adapted to receive a positive voltage supply and a negative voltage supply, respectively;

an input terminal being adapted to receive the photodiode input current signal and a feedback signal;

an output terminal coupled to the input terminal to provide the feedback signal and an output voltage signal;

first and second input transistors coupled together and to the input terminal;

biasing circuitry coupled to the first and second input transistors, the biasing circuitry establishing first and second quiescent currents through the first and second input transistors, respectively, the currents through the first and second input transistors varying in opposite directions from the first and second quiescent currents in response to the photodiode input current signal;

first and second operational amplifier current mirror circuits, one of the first and second operational amplifier current mirror circuits having an offset voltage trimmed to match the offset voltage of the other of the first and second operational amplifier current mirror circuits such that input current due to mismatching between the first and second current mirror circuits approaches zero, and being coupled to the first and second input transistors, for providing first and second mirrored currents which are substantially proportional to current passing through the first and second input transistors, respectively, the current mirror circuits being coupled to the output terminal, the mirrored currents providing an output voltage signal at the output terminal, the output voltage signal providing the feedback signal, the current mirror circuits being coupled to the first and second supply terminals.

* * * * *